(12) United States Patent
Lee

(10) Patent No.: US 6,200,855 B1
(45) Date of Patent: Mar. 13, 2001

(54) SEMICONDUCTOR MEMORY DEVICE, AND METHOD FOR FABRICATING THEREOF

(75) Inventor: Kyu-Pil Lee, Sungnam-shi (KR)

(73) Assignee: Samsung Electronics Co., Ltd., Suwon (KR)

( * ) Notice: Subject to any disclaimer, the term of this patent is extended or adjusted under 35 U.S.C. 154(b) by 0 days.

(21) Appl. No.: 09/369,969

(22) Filed: Aug. 6, 1999

(30) Foreign Application Priority Data

Aug. 10, 1998 (KR) .................................................. 98-32461

(51) Int. Cl.[7] .............................................. H01L 21/8242
(52) U.S. Cl. .......................... 438/255; 438/253; 438/258; 438/241; 438/396; 257/296
(58) Field of Search .................................... 438/255, 241, 438/258, 253, 396; 257/296

(56) References Cited

U.S. PATENT DOCUMENTS

| | | | |
|---|---|---|---|
| 5,612,241 | * 3/1997 | Arima | 437/52 |
| 6,008,084 | * 12/1999 | Sung | 438/241 |
| 6,022,776 | * 2/2000 | Lien et al. | 438/253 |
| 6,037,215 | * 3/2000 | Lee et al. | 438/253 |

OTHER PUBLICATIONS

Lee et al., "A Process Technology for 1 Giga-Bit DRAM", pp. 907–910, IEDM 1995.*

Sim et al., "A New Planar Stacked Technology (PST) for Scaled and Embedded DRAMs", pp. 597–600, IEDM 1996.*

* cited by examiner

*Primary Examiner*—Matthew Smith
*Assistant Examiner*—Belur Keshavan
(74) *Attorney, Agent, or Firm*—Cantor Colburn LLP

(57) ABSTRACT

A semiconductor memory device and a fabricating method therefor are disclosed. The semiconductor memory device includes a peripheral region and a core region containing a transistor with at least a p+ impurity region. An inter-layer insulating layer is formed on an entire surface of a semiconductor substrate. Then the insulating layer is etched by using a contact forming mask until the surface of the p+ impurity region of the core region is exposed, so as to form contact holes. The contact holes are then filled with a metal to form contacts so as to be electrically connected to the semiconductor substrate. The present invention solves the conventional problem that the contact plug reacts with the impurity ions of the p+ impurity region during the heat treatment, thereby increasing the contact resistance. That is, in the present invention, the contact for the wiring on the semiconductor substrate of the p+ impurity region is directly formed after the formation of the memory cells in the cell region at a high temperature. Therefore, the succeeding high temperature process steps are simplified, and therefore, the metal layer is prevented from being reacted with the impurity ions, thereby preventing the increase of the contact resistance. Thus, a stable performance of the semiconductor device is ensured.

13 Claims, 5 Drawing Sheets

SEMICONDUCTOR MEMORY DEVICE, AND METHOD FOR FABRICATING THEREOF

FIELD OF THE INVENTION

The present invention relates to semiconductor manufacturing, and more particularly to a semiconductor memory device and a method for fabricating thereof.

BACKGROUND OF THE INVENTION

The semiconductor technology is heading toward higher capacity and higher performance, and techniques are being developed according to this trend. In a dynamic random access memory device (DRAM), the capacity is being greatly increased and in this situation, complicated techniques for fine structures are being developed.

In order to see into the DRAM devices which have been developed so far, a self-aligned contact (SAC) is introduced into the cell. Such a feature is disclosed in a number of references (e.g., IEDM 95 pp 907/IEDM 96 pp 597). Further, in a metallization process, the conventional polycide structure is being replaced with metal structures (IEDM 96 pp 597). That is, the metal wiring, particularly the bit lines, are being shifted from the conventional polycide structure to metal lines, thereby improving the performance of the device.

FIG. 1 is a sectional view of a conventional semiconductor memory device of the prior art.

Referring to FIG. 1, the method for fabricating this conventional semiconductor memory device will be described. First, an element isolating region 12 is formed on a semiconductor substrate 10, for defining an active region and an inactive region, and the active region comprises a cell region, a core region and a peripheral region. Then a gate electrode 14 (a conductive layer) is formed on the active region of the semiconductor substrate 10. The gate electrode 14 comprises a polysilicon layer 14a and a tungsten silicide layer 14b sequentially stacked. The upper face and the side walls of the gate electrode 14 are covered by insulating layers such as a mask insulating layer 14c and a nitride film spacer 15. These insulating layers have an etch selection ratio relative to an oxide inter-layer insulating layer.

Then high concentration impurity ions are implanted into the semiconductor substrate 10 at both side portions of the gate electrode 14 by applying a well known ion-implanting process. As a result of this process, a source/drain region is formed. In this manner, there is formed a MOS transistor which includes the gate electrode 14 and the source/drain region. An n type high concentration impurity and a p type impurity are doped into the core region, so as to form an n+ impurity region 16a and a p+ impurity region 16b. In the peripheral region, there are implanted high concentration impurity ions so as to form an n+ impurity region 16c.

Then a first insulating layer 18 is formed on the semiconductor substrate, covering the gate electrode 14. For example, the first insulating layer 18 may be a BPSG layer. Then by using a photoresist pattern as the mask, the first insulating layer 18 is etched until the source/drain regions between the gate electrodes 14 are exposed, thereby forming an open region. For example, the open region is filled with polysilicon, and thus, a bit line pad poly 20a and a storage pad poly 20b are formed.

Then a second insulating layer 22 is formed on the first insulating layer 18, covering the pad polys 20a and 20b. For example, the second insulating layer 22 may be a P-TEOS layer. Then a contact forming region is defined on the second insulating layer 22 by applying the above described process. Then by using a photoresist film pattern (not shown in the drawings) as the mask, the second insulating layer 22, the first insulating layer 18 and the mask nitride layer 14c of the gate electrode 14 are partly etched, thereby forming contact holes. Then the photoresist layer is removed.

Then the contact holes are filled with a multi-layered metal layer so as to form contact plugs 24a to 24d. For example, the multi-layered metal layer may comprise a Ti or Co layer, a CVD TiN layer and a tungsten layer (not shown in the drawings). The Ti or Co layer is for forming an ohmic layer, while the CVD TiN layer serves as a barrier for preventing the diffusion of materials.

Then a bit line forming metal layer 26a and a mask nitride layer 26b are sequentially formed on the second insulating layer 22, covering the contact plugs 24a to 24d. For example, the metal layer 26a may be tungsten (W). Then by using a bit line forming mask, the mask nitride layer 26b and the metal layer 26a are sequentially etched. In this manner, bit lines 26 are formed in the cell region. The bit lines 26 are electrically connected through the contact plugs 24a to the semiconductor substrate 10 and the contact plugs 24a are electrically connected to the bit line pad poly 20a. During the formation of the bit lines 26, pads 26' for forming the wiring are formed in the core region and the peripheral region.

Then nitride film spacers 27 are formed on both of the side walls of the bit lines 26 and the pads 26'. Then a third insulating layer 28 is formed on the front face of the semiconductor substrate 10. The third insulating layer 28 is an HDP oxide layer. Then the third and second insulating layers 28 and 22 are etched by using a storage node contact forming mask, until the surface of the storage node forming pad poly 20b of the cell region is exposed, thereby forming a storage node contact hole 30. Then a polysilicon layer is formed on the third insulating layer 28, covering the contact hole 30. Then a patterning is carried out to form a lower capacitor electrode 32, i.e., a storage node. Then a capacitor is formed by applying the generally known DRAM capacitor forming process.

As described above, in the case where the wiring is formed of a metal, particularly, in the case where the DRAM bit line is composed of a metal, the metal bit forming process invites many problems due to the excessive heat released during the capacitor forming process. As can be seen in IEDM 96 pp 597, the p+ impurity region 16b which has been used to electrically connect the core region to the peripheral region comes to have a resistance of several thousand Ohm/contact. As a result, the size of the contact is reduced to 0.15 μm×0.15 μm or less. Therefore, the resistance is increased to several scores of thousands or several hundreds of thousands ohm/contact, with the result that the performance of the device is drastically deteriorated.

This is due to an absorption of the materials of the contact plugs into the silicide layer of the bottom of the contact which is formed. This contact is used to form an ohmic layer. When carrying out the finish process at a high temperature, the smaller the size of the contact, the severer the phenomenon becomes. However, the use of a metal for the bit lines 26 not only improves the performance of the device, but also the problem of the photo DOF (depth of focus margin) is bettered, as well as ameliorating the overall structural characteristics.

Then a fourth insulating layer 36 is formed on the third insulating layer 28, covering the capacitor completely. The fourth insulating layer 36 consists of a TEOS layer and a USG layer. Then by using a contact hole forming mask, the fourth and third insulating layers 36 and 28 are sequentially etched until the surface of the metal layer 26a is exposed, thereby forming contact holes. The contact holes are filled with a metal, e.g., tungsten, and thus, contacts 38a and 38b are formed for being electrically connected to the pads 26'.

Then a wiring 40 is formed on the fourth insulating layer, for being electrically connected to the contacts 38a and 38b. For example, the metal wiring 40 may be composed of aluminum (Al). More wiring may be formed on the metal wiring as shown in the drawing.

SUMMARY OF THE INVENTION

The present invention is intended to overcome the above described disadvantages of the conventional technique.

Therefore it is an object of the present invention to provide a semiconductor memory device and a fabricating method therefor which can reduce the contact resistance between the p+ impurity region and metal line.

In achieving the above object, the method of the present invention for fabricating a semiconductor memory device having a peripheral region and a core region including a transistor with at least a p+ impurity region comprises: forming an inter-layer insulating layer on the entire surface of a semiconductor substrate; etching the insulating layer by using a contact forming mask until a surface of the p+ impurity region of the core region is exposed, so as to form contact holes; and filling the contact holes with a metal to form contacts so as to be electrically connected to the semiconductor substrate.

In another aspect of the present invention, the method of the present invention for fabricating a semiconductor memory device having a cell region, a core region and a peripheral region comprises: forming a gate electrode on a semiconductor substrate, and covering the upper surface and side walls of the gate electrode with an insulating material; implanting impurity ions into the semiconductor substrate at both sides of the gate electrode to form a first conduction type region and a second conduction type region; forming a first insulating layer on the semiconductor substrate, covering the gate electrode; etching the first insulating layer by using a contact hole forming mask until a surface of the gate electrode (excluding the second conduction type region) and a surface of the semiconductor substrate of the first conduction type region are exposed, so as to form contact holes; filling the contact holes with a multi-layered metal layer to form contact plugs; forming a pad on the first insulating layer so as to be electrically connected to the contact plugs, and making the upper face and side walls of the pad covered with an insulating material; forming a second insulating layer on the first insulating layer, covering the pad; sequentially etching the second and first insulating layers and the insulating material by using a contact hole forming mask until the surface of the semiconductor substrate portion of the second conduction type region and the surface of the pad are exposed, so as to form contact holes; and filling the contact holes with a metal layer to form contacts for connecting a wiring.

In still another aspect of the present invention, the semiconductor memory device according to the present invention includes: a semiconductor substrate having a cell region with a memory cell formed therein, a core region having a transistor with at least a p+ impurity region therein, and a peripheral region; an inter-layer insulating layer formed on the entire face of the semiconductor substrate, covering the cell region, the core region and the peripheral region; and a contact passing through the inter-layer insulating layer to be electrically connected to the p+ impurity region.

BRIEF DESCRIPTION OF THE DRAWINGS

The above object and other advantages of the present invention will become more apparent by describing in detail the preferred embodiment of the present invention with reference to the attached drawings in which.

DETAILED DESCRIPTION OF THE PREFERRED EMBODIMENT

Figure 1:
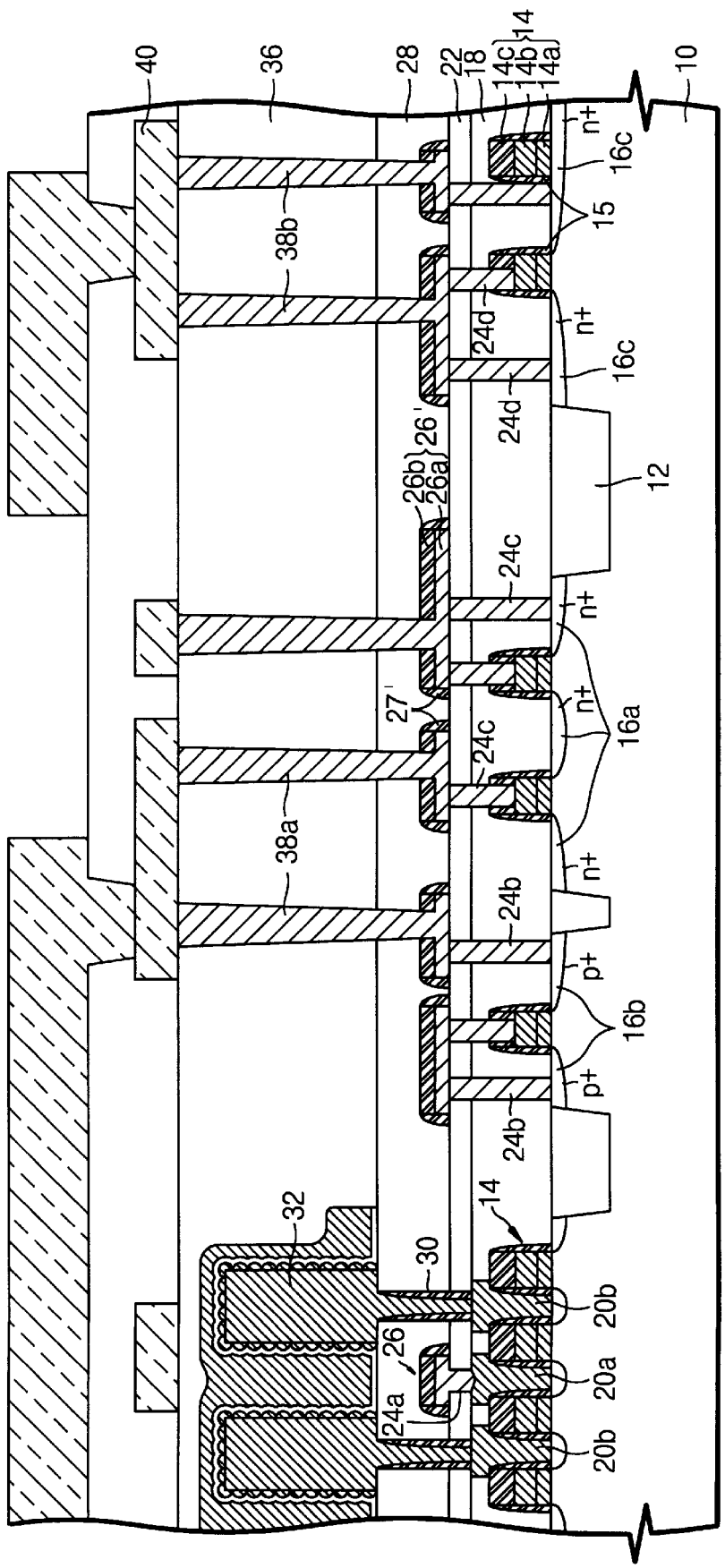
FIG. 1 is a sectional view of a conventional semiconductor memory device.
Figure 2A:
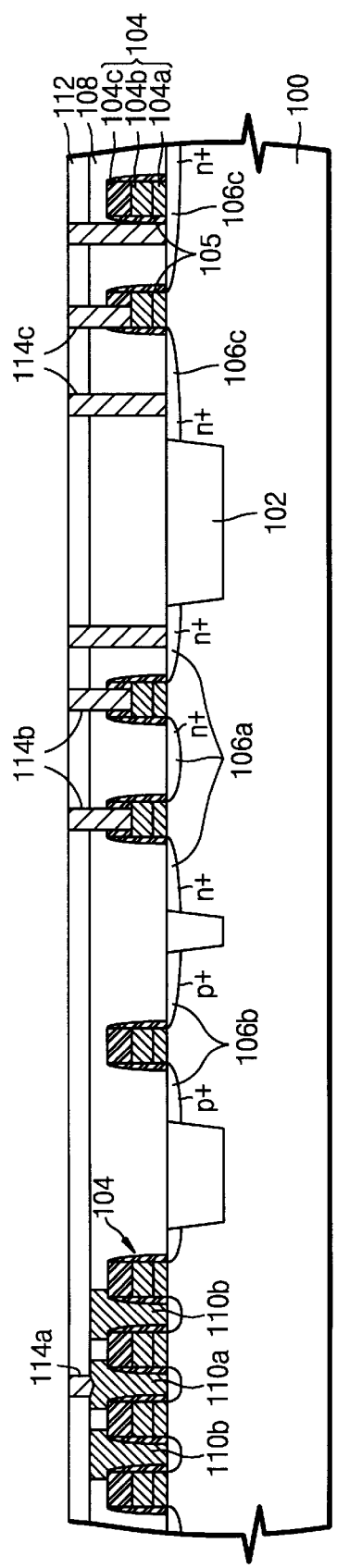
FIGS. 2A to 2D are sectional views showing the fabricating process for the semiconductor memory device according to the present invention.
Figure 2B:
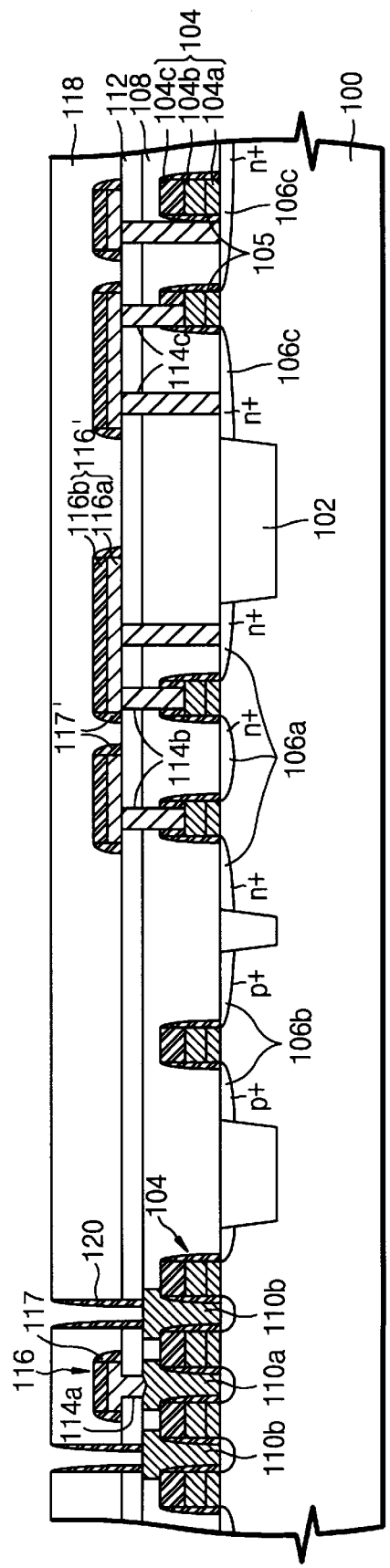
Figure 2C:
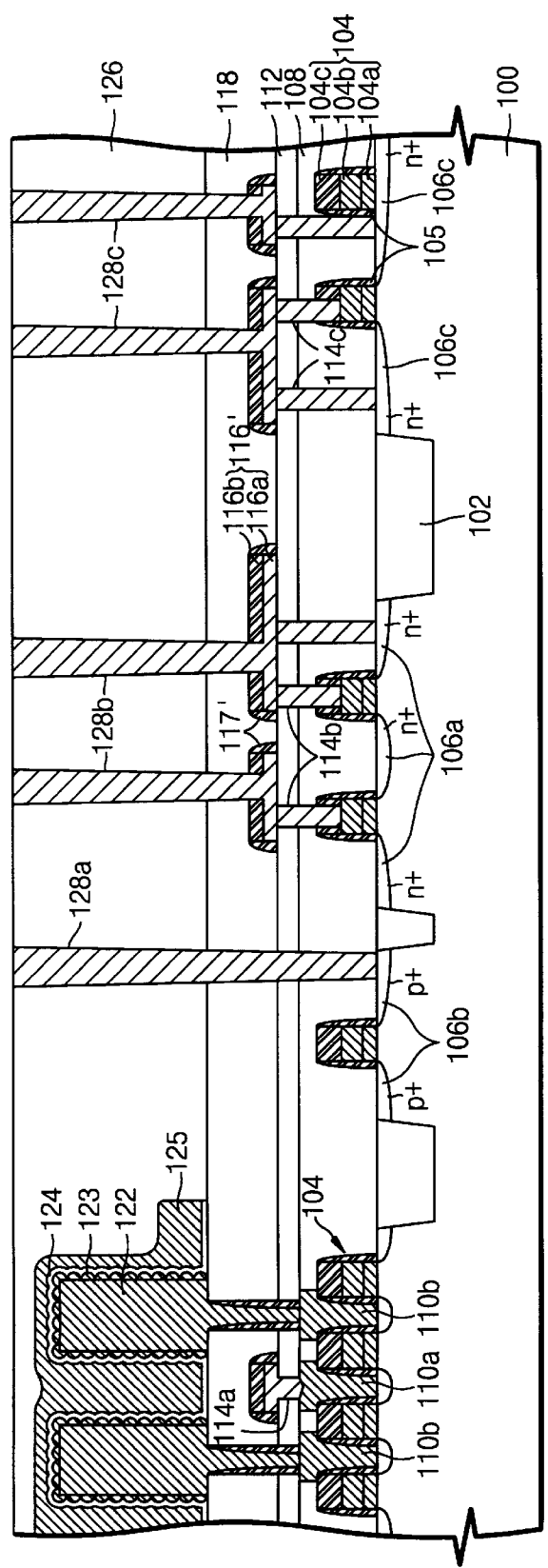

Referring to FIG. 2C, the method for fabricating the semiconductor memory device according to the present invention is carried out in the following manner. That is, a cell region with a memory cell formed therein, a core region having a transistor with at least a p+ impurity region, and a peripheral region on a semiconductor substrate are formed according to the present invention. Then an inter-layer insulating layer is formed on the entire surface of the semiconductor substrate. Then by using a contact hole forming mask, the insulating layer is etched until a surface of the p+ impurity region of the core region is exposed, thereby forming contact holes. Then the contact holes are filled with a metal to form contacts so as to be electrically connected to the semiconductor substrate. Through this fabricating process, the contact is directly formed in the semiconductor substrate of the p+ impurity region after the formation of the cell of the cell region at a high temperature. Therefore, the number of the succeeding process steps is decreased, and therefore, the reaction between the metal layer and the impurity ions can be inhibited, with the result that the resistance of the contact is not increased. Therefore, a stable performance of the device can be ensured.

Now an exemplary embodiment of the present invention will be described referring to FIGS. 2A to 2D.

A cell region with a memory cell formed therein, a core region having a transistor with at least a p+ impurity region, and a peripheral region are formed on a semiconductor substrate. An inter-layer insulating layer is formed on the entire surface of the semiconductor substrate. A contact is formed through the inter-layer insulating layer to be electrically connected to the p+ impurity region.

Now the method for fabricating a semiconductor memory device according to the present invention will be described.

FIGS. 2A to 2D are sectional views showing the fabricating process for the semiconductor memory device according to the present invention.

Referring to FIG. 2A, first a device isolating region 102 is formed on a semiconductor substrate 100, for defining an inactive region and an active region. The active region includes a cell region, a core region and a peripheral region. The isolating region 102 is formed by applying the generally known LOCOS (local oxidation of silicon) process or the trench isolation process. Then a gate electrode 104 (a conductive layer) is formed on the active region. The gate electrode 104 comprises a polysilicon layer 104a and a tungsten silicide layer 104b sequentially stacked. An upper face and both side walls of the gate electrode 104 are made to be covered by insulating layers such as a mask insulating layer 104c and a nitride spacer 105 having an etch selection ratio relative to the oxide type inter-layer insulating layer. High concentration impurity ions are implanted into the semiconductor substrate 100 at both sides of the gate electrode 104, thereby forming a source/drain region. In this manner, a MOS transistor comprises the gate electrode 104 and the source/drain region is formed. An n type impurity and a p type impurity are doped into the core region, to form an n+ type impurity region 106a and a p+ type impurity region 106b. Meanwhile, high concentration n type impurity ions are implanted into the peripheral region to form an n+ type impurity region 106c.

Then a first insulating layer 108 is formed on the semiconductor substrate 100, covering the gate electrode 104. The first insulating layer 108 may be for example a BPSG layer. Then by using a photoresist pattern as a mask, the first insulating layer 108 is etched until an upper face of the source/drain regions between the gate electrodes 104 is exposed, thereby forming an open region. For example, the open region may be filled with polysilicon to form a bit line forming pad poly 110a and a storage node forming pad poly 110b. The formation of a short circuit between the gate electrode 104 and the pad polys 110a and 110b is prevented by the nitride spacer 105 and the mask nitride layer 104c which surround the gate electrode 104.

Then a second insulating layer 112 is formed upon the first insulating layer 108, covering the pad polys 110a and 110b. For example, the second insulating layer 112 may be a P-TEOS layer. A contact forming region is defined on the second insulating layer 112 based on the above described manner. Then by using a photoresist layer pattern as the mask, an etch is carried out through the second insulating layer 112, the first insulating layer 108 and the mask nitride layer 104c of the gate electrode, thereby forming contact holes 114a to 114c.

In other words, by using the above mask, an etch is carried out until the bit line forming pad poly 110a of the cell region (except the p+ impurity region 108b), the n+ impurity region 108a and the gate electrode conductive layer 104a of the core region, and the n+ impurity region 106c and the gate electrode conductive region 104b of the peripheral region are exposed, thereby forming contact holes 114a to 114c. Then the photoresist layer pattern is removed.

One of a Ti layer and a Co layer is then deposited on the side walls and bottoms of the contact holes 114a to 114c. The Ti layer or the Co layer is for forming an ohmic layer, and is formed in a thickness of several hundred Å. The thickness can be varied depending on the process conditions. In addition, the contact characteristics are very sensitive to the thickness of the layer. Then a TiN layer is stacked as a barrier for preventing the diffusion of the materials of the Ti layer and the Co layer. Finally, the contact holes are filled with tungsten (W).

Alternatively, after the formation of the ohmic layer, a barrier layer may be formed after the removal of the residual Ti or Co layer which remains without being reacted with the semiconductor substrate 100 (except the bottom of the contact). Further, the barrier metal may be directly used as the wiring so as to skip the W filling step. Such a process variation can be adopted in accordance with the device requirement conditions and the process conditions.

Referring to FIG. 2B, a bit line forming metal layer 116a and a mask nitride layer 116b are sequentially formed on the second insulating layer 112, covering the contact plugs. For example, the metal layer may be a tungsten layer. Then the mask nitride layer 116b and the metal layer 116a are sequentially etched by using a bit line forming mask. Thus there are formed bit lines 116 and wiring pads 116' simultaneously, the bit lines 116 being electrically connected through the contact plugs 110a to the semiconductor substrate 100. In forming the bit lines 116 and the pads 116', the damascene process is employed. Then a nitride layer is formed on the second insulating layer 112, covering the bit lines and the pads 116 and 116'. The nitride layer is then etched back, so as to form nitride layer spacers 117 and 117' on side walls of the bit lines 116 and the pads 116'.

Then a third insulating layer 118 is formed on the entire surface of the semiconductor substrate 100. For example, the third insulating layer 118 may be an HDP oxide layer. Then the third and second insulating layers 118 and 112 are etched by using a storage node contact hole forming mask until the surface of the storage node forming pad poly 110b is exposed, thereby forming a storage node contact hole 120. Then nitride layer spacers are formed on the side walls of the contact hole 120.

Referring to FIG. 2C, a storage node forming conductive layer is formed on the third insulating layer 118, covering the contact hole 120. Then a patterning is carried out to form a storage node, i.e., a lower electrode 122 of the capacitor. A hemispherical grain layer 123 is then formed on the lower capacitor electrode 122, and then, a dielectric layer 124 and an upper capacitor electrode 125 are formed, thereby completing the formation of a capacitor. The conductive layer preferably comprises polysilicon, while the dielectric layer comprises a high permittivity layer such as a BST layer or a $Ta_2O_5$ layer.

Then a fourth insulating layer 126 is formed on the entire surface of the semiconductor substrate 100. For example, the fourth insulating layer 126 comprises a TEOS layer and a USG layer stacked together. Then the fourth insulating layer 126, the third insulating layer 118, the mask nitride layer 116b, the second insulating layer 112 and the first insulating layer 109 are etched by using a contact hole forming mask until the p+ impurity region 106b and the pad metal layer 116a of the core region, and the pad metal layer 116a of the peripheral region, are exposed, thereby forming contact holes 128a to 128c.

Under this condition, in the contact hole 128a of the p+ impurity region, the occupation ratio of the p+ impurity region in the whole area of the chip is smaller compared with conventional devices. Therefore, the contact hole can be formed in a larger size within the p+ impurity region, to realize a thicker contact plug (here, the increase of the total area of the chip is negligible). Therefore, the increase of the resistance due to the reaction of the ohmic layer can be prevented. Then the contact holes 128a to 128c are filled with a metal, and thus contacts which are indirectly connected to the semiconductor substrate 100 are formed.

In forming the wiring to the n+ impurity regions 106a and 106c, either the method of passing through the metal pad 116' as in the above described method may be adopted, or the method of directly forming the contact holes in the n+ impurity regions 106a and 106c as in the wiring method of the p+ impurity region 106b may be adopted.

Figure 2D:
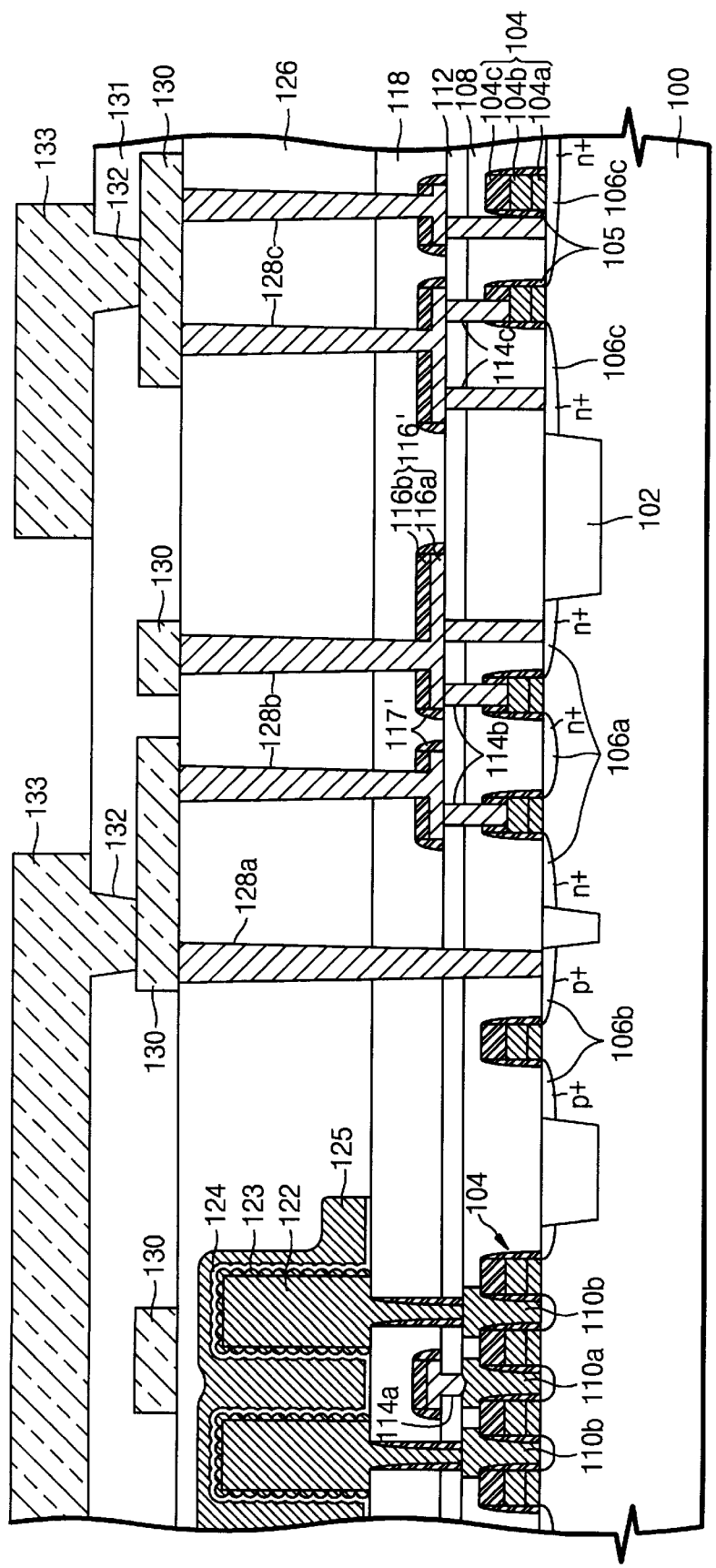

Referring to FIG. 2D, first metal wires 130 are formed on the fourth insulating layer 126 so as to be electrically connected to the contacts. For example, the metal layers 130 may be aluminum layers. Then a fifth insulating layer 131 is formed on the fourth insulating layer 126, covering the first metal wires 130. The fifth insulating layer 131 comprises a TEOS layer and an SOG layer stacked together. On the fifth insulating layer 131, there are formed second metal wires 133 which are electrically connected to the contacts 132 which are formed in the fifth insulating layer 131. The contacts 132 and the second metal wires 133 are preferably formed of aluminum.

Accordingly, the present invention as described above solves the conventional problem that the contact plug is reacted with the impurity ions of the p+ impurity region during the heat treatment, thereby increasing the contact resistance. That is, in the present invention, the contact for the wiring on the semiconductor substrate of the p+ impurity region is directly formed after the formation of the memory cells in the cell region at a high temperature. Therefore, the succeeding high temperature process steps are simplified, and therefore, the metal layer is prevented from being reacted with the impurity ions, thereby preventing the increase of the contact resistance. Therefore, a stable performance of the semiconductor device is ensured.

What is claimed is:

1. A method for fabricating a semiconductor memory device having a cell region, a core region and a peripheral region, comprising:

forming a gate electrode on a semiconductor substrate, and covering an upper surface and side walls of said gate electrode with an insulating material;

implanting impurity ions into said semiconductor substrate at both sides of said gate electrode to form a first conduction type region and a second conduction type region;

forming a first insulating layer on said semiconductor substrate, covering said gate electrode;

etching said first insulating layer until a surface of said gate electrode and a surface of said semiconductor substrate of said first conduction type region are exposed, so as to form contact holes;

filling said contact holes with a metal layer to form contact plugs;

forming a pad on said first insulating layer so as to be electrically connected to said contact plugs, and making an upper face and side walls of said pad covered with the insulating material;

forming a second insulating layer on said first insulating layer, covering said pad;

sequentially etching said second and first insulating layers and said insulating material until a surface of said semiconductor substrate of at least said second conduction type region and a surface of said pad are exposed, so as to form second contact holes; and filling said second contact holes with a metal layer to form contacts for connecting a wiring.

2. The method as claimed in claim 1, wherein said insulating material is silicon nitride.

3. The method as claimed in claim 1, wherein said first conduction type region is an $n^+$ impurity region and said second conduction type region is a $p^+$ impurity region.

4. The method as claimed in claim 1, wherein said first insulating layer comprises a BPSG layer and a P-TEOS layer stacked together.

5. The method as claimed in claim 1, wherein said metal layer comprises Ti/TiN/W layers stacked together.

6. The method as claimed in claim 5, wherein said Ti layer is for forming an ohmic layer and said TiN layer is a barrier film.

7. The method as claimed in claim 1, wherein said metal layer comprises Ti/TiN layers stacked together.

8. The method as claimed in claim 1, wherein said metal layer comprises TiN/W layers stacked together.

9. The method as claimed in claim 1, wherein said metal layer comprises a TiN layer.

10. The method as claimed in claim 1, wherein said pads and contacts are formed of tungsten, and said metal layer is formed of aluminum.

11. The method as claimed in claim 1, wherein said second insulating layer comprises an HDP oxide layer, a TEOS layer and a USG layer stacked together.

12. A method for fabricating a semiconductor memory device including a peripheral region and a core region having at least one $n^+$ impurity region and at least one $p^+$ impurity region, comprising:

forming a lower inter-layer insulting layer over an entire surface of a semiconductor substrate;

etching the lower inter-layer insulating layer to form an $n^+$ contact hole exposing the $n^+$ impurity region;

forming a pad metal layer covering the $n^+$ contact hole;

forming an upper inter-layer over the lower inter-layer insulating and the pad metal layer;

etching the upper inter-layer insulating layer and the lower inter-layer insulating layer to form a $p^+$ contact hole exposing the $p^+$ impurity region and a metal contact hole exposing the pad metal layer; and filling the $p^+$ contact hole and the metal contact hole with a metal to form contacts for connecting a wiring.

13. A semiconductor memory device comprising:

a semiconductor substrate including a cell region with a plurality of memory cells formed therein, a core region having at least one $n^+$ impurity region and at least one $p^+$ impurity region formed therein, and a peripheral region;

a lower inter-layer insulating layer covering the semiconductor substrate;

a pad metal contact passing through the lower inter-layer insulating layer, the pad metal contact being electrically connected to the $n^+$ impurity region;

an upper inter-layer insulating layer covering the pad metal layer and the lower inter-layer insulating layer; and a metal contact passing through the upper inter-layer insulating layer and the lower interlayer insulating layer, the metal contact being electrically connected to the $p^+$ impurity region.

* * * * *